(12) United States Patent
Gaal et al.

(10) Patent No.: US 6,538,733 B2
(45) Date of Patent: Mar. 25, 2003

(54) RING CHUCK TO HOLD 200 AND 300 MM WAFER

(75) Inventors: Christopher Gaal, Mansfield, MA (US); Jaydeep Sinha, Norwood, MA (US)

(73) Assignee: ADE Corporation, Westwood, MA (US)

( * ) Notice: Subject to any disclaimer, the term of this patent is extended or adjusted under 35 U.S.C. 154(b) by 0 days.

(21) Appl. No.: 09/934,038

(22) Filed: Aug. 21, 2001

(65) Prior Publication Data

US 2002/0024174 A1 Feb. 28, 2002

Related U.S. Application Data

(60) Provisional application No. 60/227,071, filed on Aug. 22, 2000.

(51) Int. Cl.$^7$ ............................................. G01N 21/01
(52) U.S. Cl. ..................................................... 356/244
(58) Field of Search ............................... 356/244, 246; 269/20, 21, 900, 279, 296, 286; 294/64.1, 64.2, 64.3, 65, 902, 907

(56) References Cited

U.S. PATENT DOCUMENTS

| | | | |
|---|---|---|---|
| 4,158,171 A | 6/1979 | Abbe et al. | 324/158 F |
| 4,796,562 A | 1/1989 | Brors et al. | 118/725 |
| 4,846,452 A | 7/1989 | Geneczko | 269/21 |
| 4,849,916 A | 7/1989 | Abbe et al. | 364/563 |
| 5,923,408 A * | 7/1999 | Takabayashi | 355/53 |
| 6,032,997 A | 3/2000 | Elliott et al. | 294/64.1 |
| 6,073,681 A | 6/2000 | Getchel et al. | 165/80.1 |
| 6,164,633 A | 12/2000 | Mulligan et al. | 269/21 |
| 6,196,532 B1 | 3/2001 | Otwell | 269/21 |
| 6,257,564 B1 | 7/2001 | Avneri et al. | 269/21 |

* cited by examiner

*Primary Examiner*—Michael P. Stafira
(74) *Attorney, Agent, or Firm*—Weingarten, Schurgin, Gagnebin & Lebovici LLP

(57) ABSTRACT

A ring chuck that holds a wafer with a vacuum uses a vacuum trough that contacts the entire outer edge of the wafer. The chuck has a base having a top surface equal to or slightly smaller than a wafer to be tested with vacuum channels in the base. The base provides the mechanism to connect the chuck to a measurement instrument and a vacuum source. An annulus of non-contaminant material that has a plurality of concentric rings extending upward from its outer edge is fixed to the base top surface with the trough between the concentric rings connected to the vacuum channels. The vacuum trough holds the wafer securely to the chuck and minimizes vibrations when the wafer is rotated. When the plurality of concentric rings are contained within the wafer exclusion band, the print through onto the tested area is minimized. The tops of the concentric rings are minimally elevated from the top surface of the base and form a sealed volume that supports the interior portion of the wafer. The tops are also made very narrow to allow small deformations, minimize contamination of the wafer and restrict the transfer of particles between the chuck and the wafer. In addition, the narrow rings limit the number of particles already on the backside of the wafer that are forced onto the wafer. The consistent support provided by the ring chuck simplifies modeling of the chuck/wafer system under rotation, improving the ability to remove the instrument signature from measurements.

10 Claims, 7 Drawing Sheets

RING CHUCK TO HOLD 200 AND 300 MM WAFER

CROSS REFERENCE TO RELATED APPLICATIONS

This application claims the benefit under 35 U.S.C. § 119(e) of U.S. Provisional Application No. 60/227,071, filed Aug. 22, 2000, the entire disclosure of which is incorporated herein by reference.

STATEMENT REGARDING FEDERALLY SPONSORED RESEARCH OR DEVELOPMENT

N/A

BACKGROUND OF THE INVENTION

The present invention relates generally to semiconductor test equipment and, more specifically, to chucks used to hold wafers to be tested. Semiconductor manufacturers test semiconductor wafers throughout the manufacturing process but especially before they are processed to produce integrated circuits. The flattest wafers with the smoothest surface have been shown to yield the highest number of acceptable integrated circuits. Therefore, there is an increasing demand to produce test equipment that can detect microscopic defects in the wafers.

Integrated circuits are predominantly manufactured from 200 mm or 300 mm semiconductor wafers. The wafers incorporate a fiducial mark, either a flat in the normally circular edge or a small notch in the edge. These fiducials provide a reference point for identifying the position of measurements on the wafer surface. Typically the outer edge of the wafer surface, approximately a 3 mm wide exclusion band, is an area from which integrated circuits are not manufactured. The fiducials are contained within this exclusion band.

The desire to measure wafers with more precision and predictability leads to the need to support a wafer with minimal and predictable deformation while maximizing stiffness. Wafers are fragile, and can only be touched by materials that will not transfer contaminants to the surface. In addition, the equipment handling the wafer must not scratch it or permanently damage it. Vacuum chucks are well suited to the purpose, but the wafer is thin enough that an image of a chuck touching one surface will be discernible on the other surface.

Prior art test equipment has held wafers to be tested using chucks with a number of vacuum ports spaced beneath the wafers to hold them securely. Chucks designed for minimal vibration have included types displaying full backside contact or having pin contacts spaced regularly across the back. The chucks must be designed to introduce minimal errors into the wafer production and testing process. Errors may be introduced by contamination from chuck material contacting the wafer. A second error source is particle transfer from the surface of the chuck. In addition, particles already on the surface of the wafer may be forced into the surface by the contacting surfaces of the chuck. The force of the vacuum on the wafer will cause an effect termed print-through where the image of the contacting points of the chuck are detectable by measurement equipment on the opposite surface of the wafer. Prior art chucks have not succeeded in holding wafers securely without sacrificing a measure of contact contamination.

Once the wafer is securely held by the chuck, the test equipment rotates the wafer beneath a sensor to test the entire surface. The accuracy of measurements taken this way is limited by the stiffness of the wafer, the vibration of the wafer, the contamination of the surfaces, the amount of print through from the chuck and the instrument noise that cannot be factored out of the measurements taken. Very slow rotation speeds, that limit the test throughput, have been necessary to limit the effects of vibration.

BRIEF SUMMARY OF THE INVENTION

A ring chuck holds a wafer in a horizontal or any other orientation with a vacuum that supports the entire outer edge of the wafer. The chuck is mounted to a measurement instrument and has a base having a top surface equal to or slightly smaller than the wafer to be tested with vacuum channels in the base. An annulus of non-contaminant material that has a plurality of concentric rings extending upward from its top surface close to its outer edge is affixed to the base and the trough between the concentric rings is connected to the vacuum channels. The vacuum trough holds a wafer securely to the chuck and minimizes vibrations when the wafer is rotated. When the plurality of concentric rings are contained within the wafer exclusion band, the print through onto the tested area is minimized. In one implementation, the tops of the concentric rings are located close to the top surface of the base and provide a sealed volume to support the interior portion of the wafer.

The tops of the concentric rings are made very narrow to minimize contamination of the wafer and to restrict the transfer of particles between the chuck and the wafer. In addition, the narrow rings limit the number of particles already on the back side of the wafer that are forced onto the wafer. The consistent support provided by the ring chuck simplifies modeling of the chuck/wafer system, improving the ability to remove the instrument signature from measurements.

Other aspects, features, and advantages of the present invention are disclosed in the detailed description that follows.

BRIEF DESCRIPTION OF THE SEVERAL VIEWS OF THE DRAWING

The invention will be understood from the following detailed description in conjunction with the drawings, of which.

DETAILED DESCRIPTION OF THE INVENTION

Figure 1:
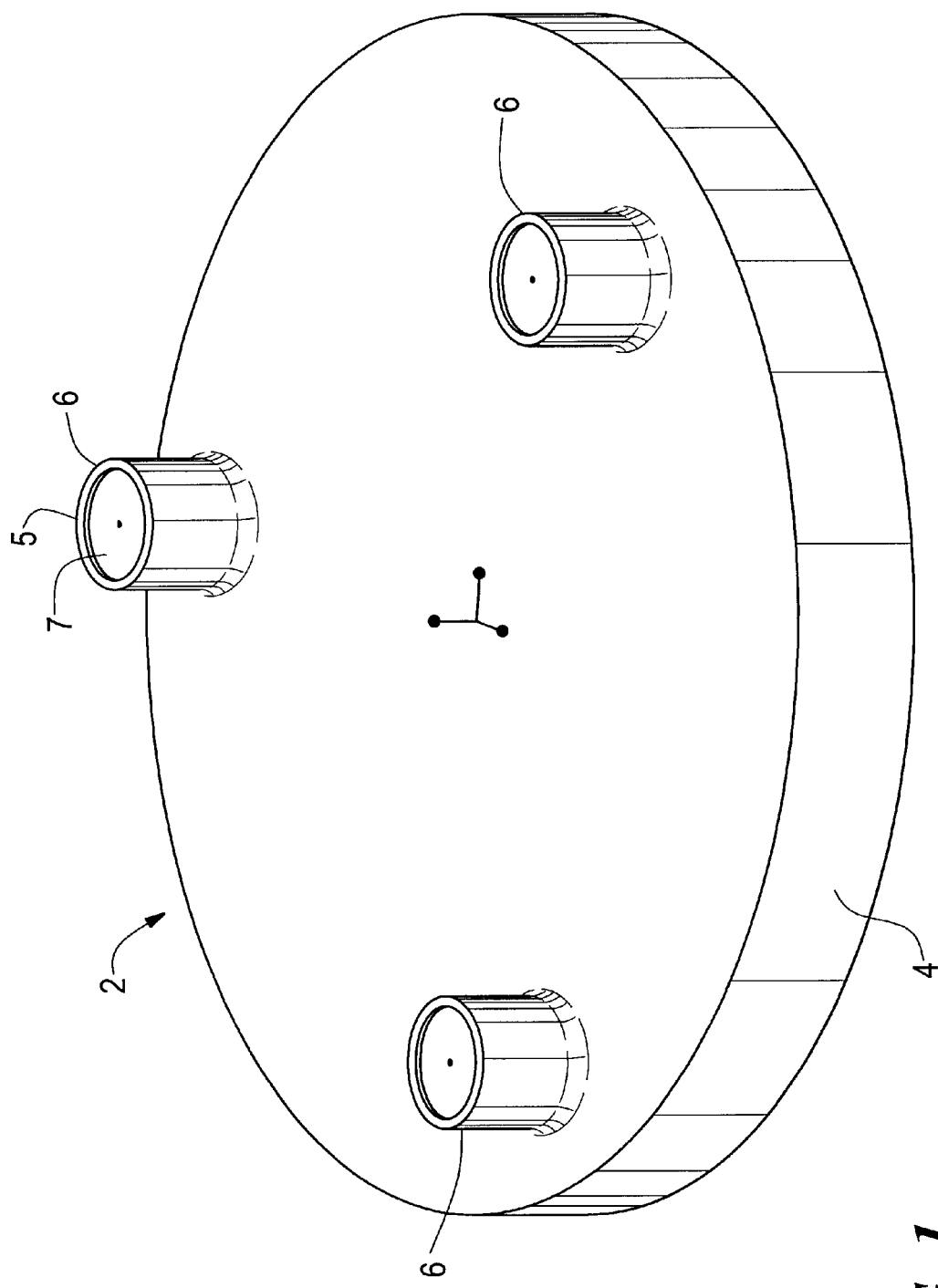
FIG. 1 is a perspective drawing of a prior art chuck to hold a wafer.

A prior art chuck 2 is shown in FIG. 1. The chuck 2 consists of a base 4 with three vacuum chuck columns 6 projecting from the base. Each column 6 has a sealing ring 5 on the upper perimeter of the column 6 and a depression 7 with a vacuum port within the sealing ring 5. A wafer (not shown) is placed above the chuck 2 and is held to the chuck 2 by the suction exerted by the vacuum columns 6. The force of the vacuum must be sufficient to hold the wafer securely and therefor print-through of the sealing rings 5 and vacuum depressions 7 of the column heads is expected. The centering of the wafer on the vacuum columns 6 must be repeatable in order to allow data analysis to remove some of the print-through artifact from the measured data. In addition, the unsupported parts of the wafer vibrate, further distorting the measurements and increasing the demand for repeatable positioning. Modeling of the chuck/wafer system can be attempted to identify some of the error sources, but empirical data is required to cope with the complexities in the system to define a partial instrument error signature.

One measurement that needs to be performed in production due to the decreasing width of the etched lines in integrated circuits is a measurement of the smoothness of a wafer's surface. This is referred to as nano-topology. A means of achieving this is to record the slope data of a wafer scan, and integrate to construct the nano-topology. This scanning method allows for the high throughput required of production measurements. To measure the entire wafer surface, the wafer must be scanned, usually by rotating under a sensor, quickly. A system that is sensitive enough to discern the nano-topology will also be sensitive to surface irregularities, surface vibration and print through effects.

Figure 2:
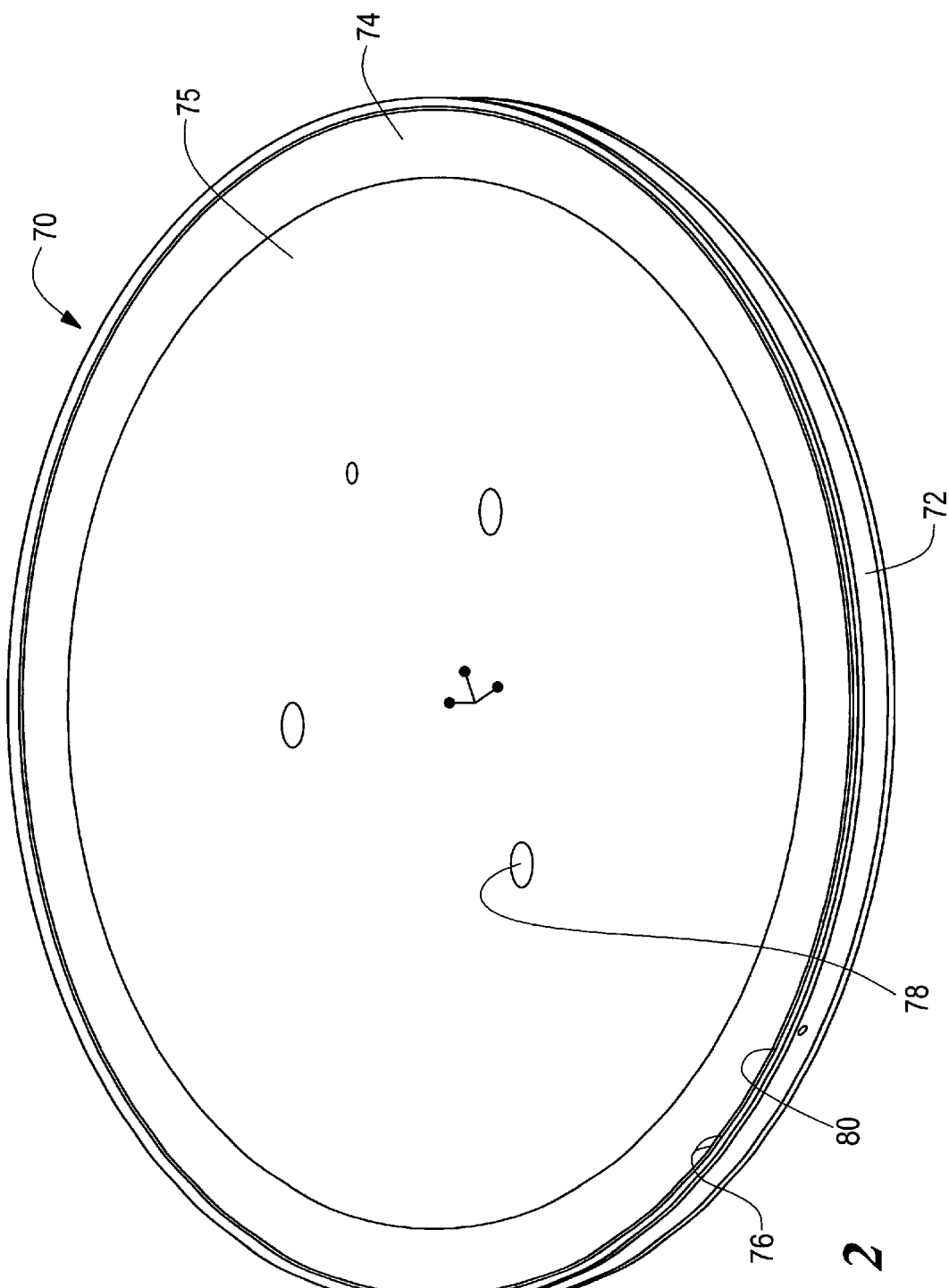
FIG. 2 is a top view of a chuck according to the invention.

The ring chuck 70 of the invention, illustrated in FIG. 2, is well adapted to these new requirements. The ring chuck 70 is comprised of a base 72, as is known in the industry, and a hoop or annulus 74 of low contaminant material affixed to the top surface 75 of the base 72. In one implementation, hoop 74 is affixed at the outer edge of top surface 75. The base 72 is formed, as is known in the industry, with channels (not shown) for vacuum delivery, and mounting facilities to secure it to a measurement instrument. The top surface 75 of the base 72 may be essentially solid or may be shaped to aid the operation of the chuck. FIG. 2 illustrates mounting holes 78 to provide a means to fasten the chuck 70 to the instrument.

The base 72 and hoop 74 are sized to correspond to the wafer to be tested. The ring chuck design is readily adaptable to wafers with diameters of 200 mm or 300 mm as well as other sizes. A number of concentric raised rings 76 circle the outer circumference of the surface of hoop 74 just in from the edge. Troughs 80 are formed in the space between the concentric rings. A vacuum source is introduced into troughs 80. After a wafer (not shown) is placed on the ring chuck 70, a relatively uniform vacuum is formed in trough 80 to hold the wafer to the ring chuck 70 around the entire circumference of the wafer. This mechanism holds the wafer and provides consistent support to all portions of the edge of the wafer.

Figure 3:
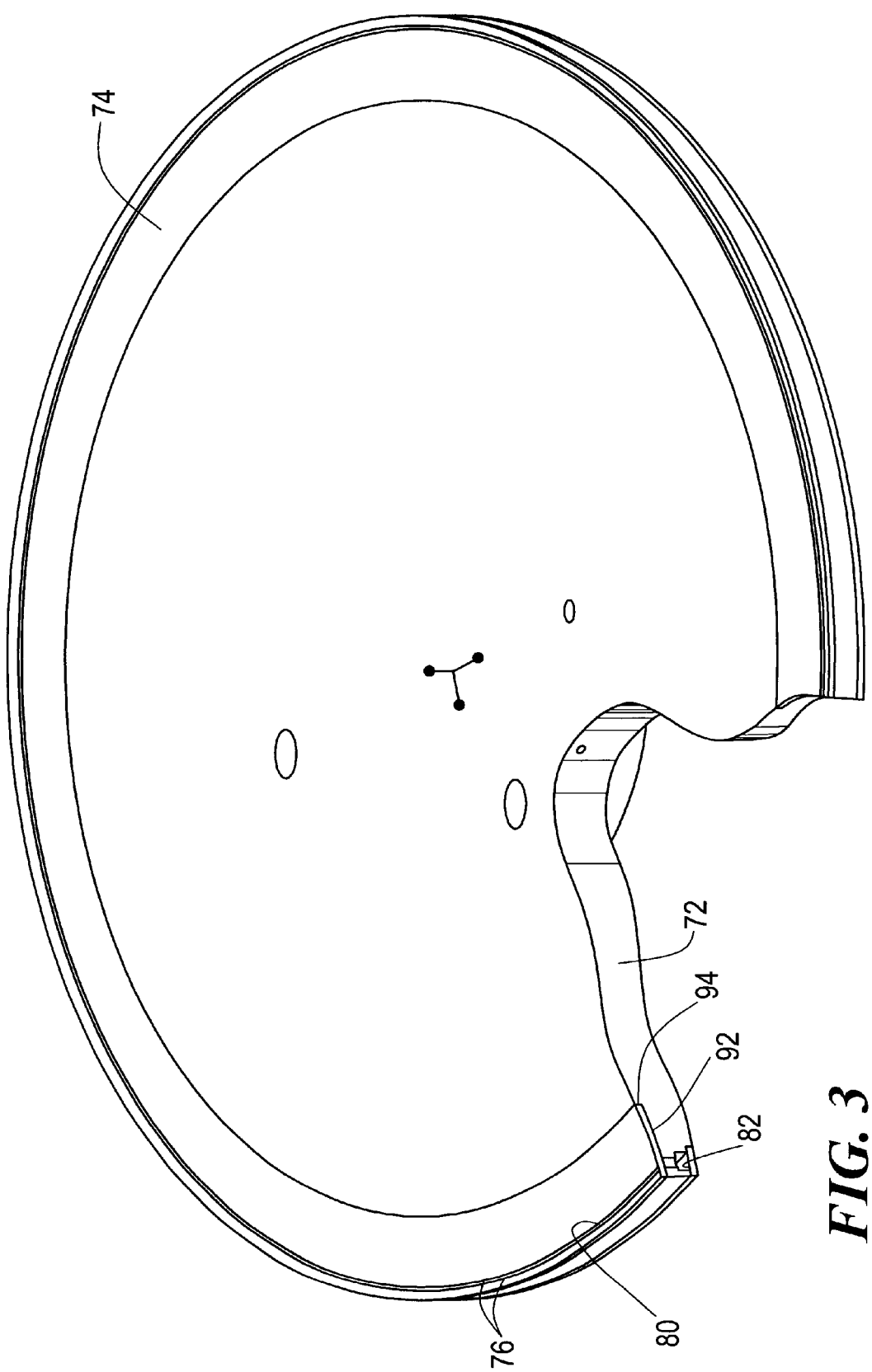
FIG. 3 is a perspective view of a chuck according to the invention.

FIG. 3 illustrates a cutaway view of the ring chuck 70. A channel vacuum distribution channel 82 is formed in the base 72 and through internal pathways (not shown) connects to a vacuum source (not shown). Further unshown channel passageways between the vacuum distribution channel 82 and the vacuum trough 80 are contained within the hoop 74. The base 72 is machined or cast as is known in the industry to provide a seating area 92 to contain the hoop 74.

Figure 4:
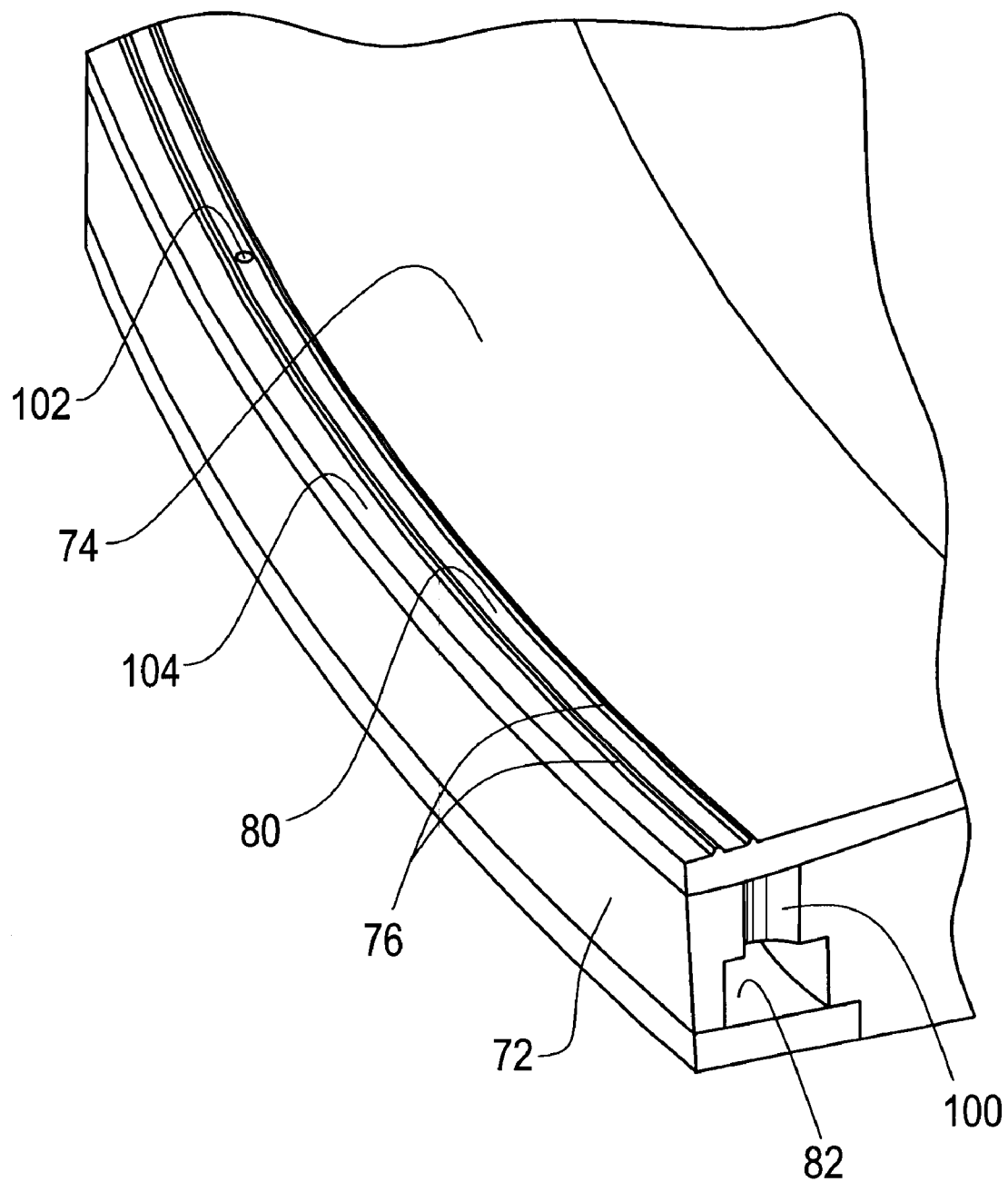
FIG. 4 is a detail cutaway of the chuck of FIG. 3.

FIG. 4 is a cutaway drawing of the edge of a ring chuck 70 that uses two rings 76 showing a vacuum channel 82 within the base 72. Distribution channels 100 and 102 bring the vacuum to trough 80 from the vacuum channel 82 The width of the rings 76 is significantly narrower than the trough In some implementations, the ratio of the width of the rings to the width of the trough is approximately 1:4. The outer ring 76 is sufficiently spaced inward from the rim of the wafer 8 that a notch fiducial (not shown) does not break the integrity of the vacuum within trough 80.

Figure 5:
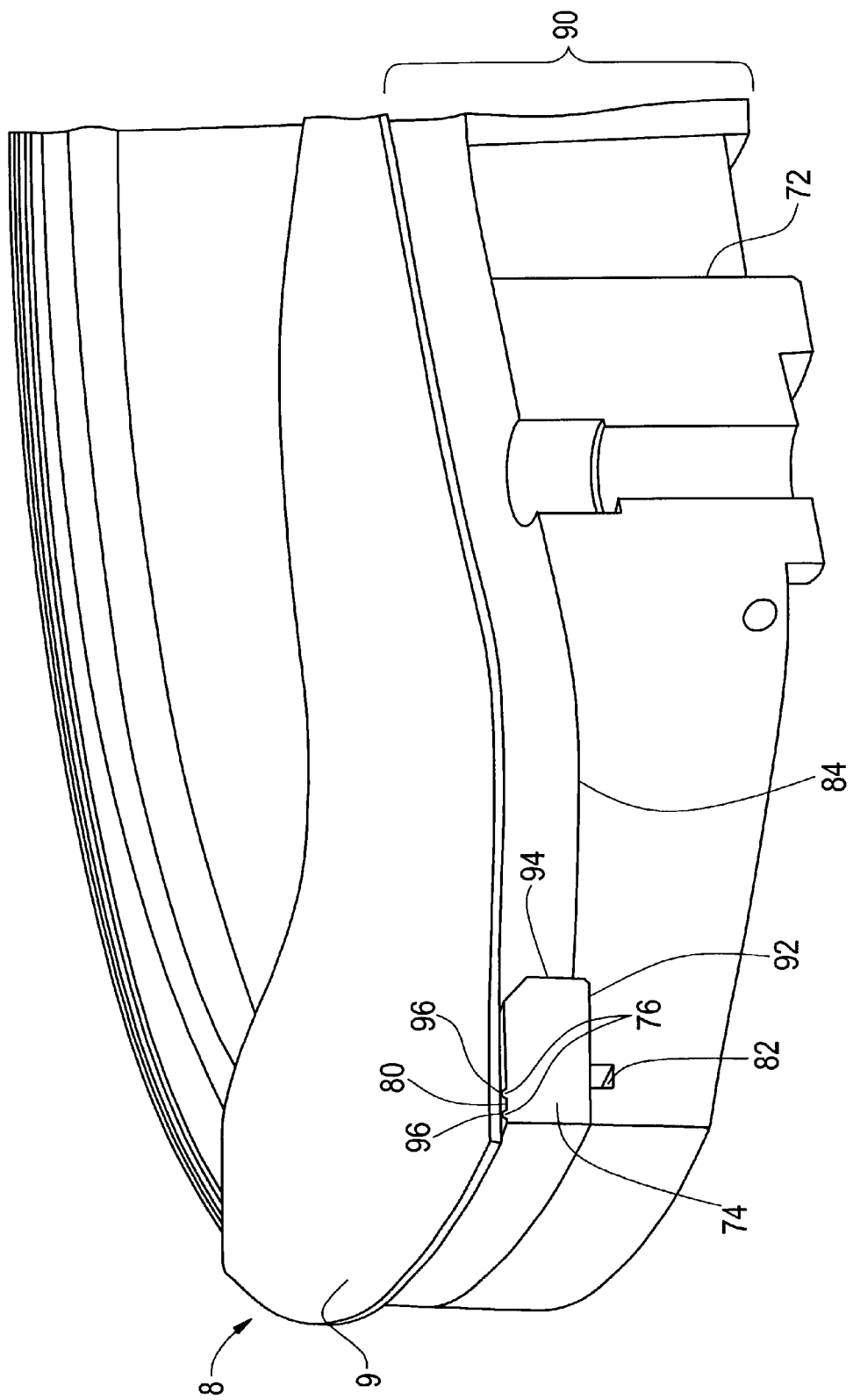
FIG. 5 is a cross section of the chuck of FIG. 3.

FIG. 5 is a cutaway drawing of the chuck 70 with a wafer 8 where the scale of the circumferential detail is enlarged relative to the radius of the wafer 8. The concentric rings 76 circumscribe the hoop 74 and are formed having peaks that are narrow in order to limit the contact of the rings with the wafer 8. The hoop 74 has a height 94 that may be modified as needed to improve operation. The ring chuck 70 may be formed minimizing the height of the space between the base 72 and the wafer 8 by modifying the height of the hoop 74 and concentric rings 76. By limiting this height, the volume of air trapped in the space dampens the vibration across the wafer and the wafer presents a more stable surface for test equipment inspection. The tapered cross section of the rings 76 is illustrated in FIG. 5. The concentric rings 76 make contact with the wafer only at the top of the rings 96. The narrow tips 96 of the rings 76 are the only part of the hoop 74 making contact with the wafer 8 thereby minimizing contact between the chuck 70 and the wafer 8. The possible contamination and area for transfer of particulate matter is minimized. It is desirable to have the total area of the rings contacting the wafer be significantly less than the area of the wafer. In particular, in an advantageous implementation with two rings 76, the area of the ring tips 96 touching the wafer 8, may be as small as 0.4% of the area of the wafer 8.

The vacuum that is maintained in trough 80 is proportional to the height and separation of the rings 76. The vacuum area 80 between the concentric rings 76 is larger than the area of the contacting rings. This allows a greater vacuum to be maintained within the vacuum trough 80. The area of the concentric ring tips 96 is less than ½ of the area of the troughs.

The vacuum and contact provided by the ring chuck 70 are readily modeled using ANSYS finite element analysis. The models make it easier to identify the error patterns in the data that are caused by the chuck. Because the contact between ring chuck 70 and wafer 8 is so regular and so close to the edge of the wafer 8, the wafer 8 is held rigid with minimal vibration along the edge. The symmetricity and uniformity of the contact and vacuum make the interaction between the contact points and the wafer easy to model. Such models have been verified by experimentation to determine the instrument signature that is subtracted from the wafer measurement to improve the results of the readings. While interruptions in the concentric rings may seem desirable for purposes such as allowing paddle access to the wafer, the models for interrupted rings are significantly more complex and show more variation and vibration of the wafer. Experimental studies confirm that breaks significantly increase the vibration and complexity of the error data.

Figure 6:
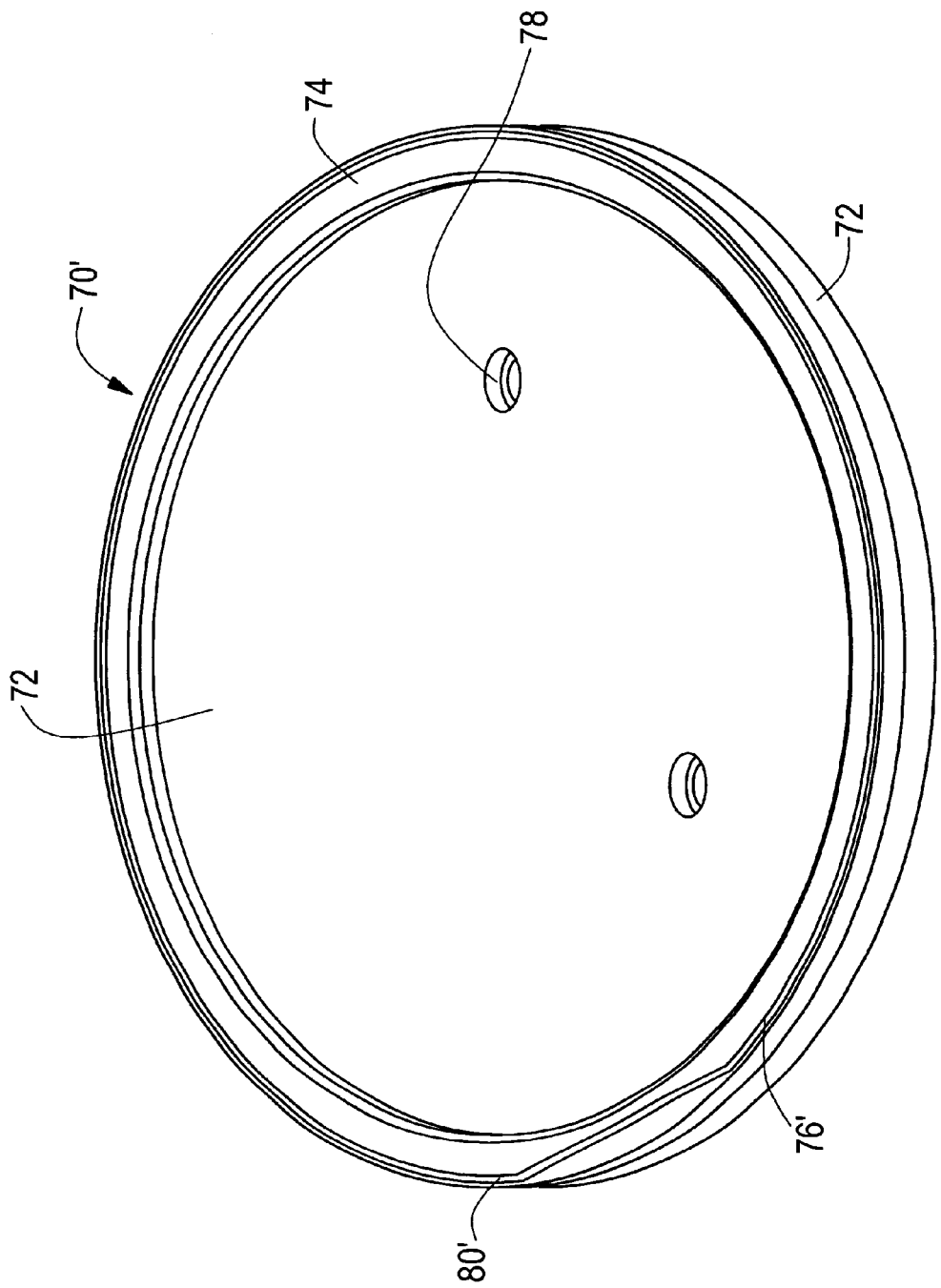
FIG. 6 is an alternate version of the chuck according to the invention.

FIG. 6 illustrates an alternate implementation of a ring chuck 70' adapted to support a wafer (not shown) with a flat-edged fiducial. In this chuck, the concentric structures 76' are circles with a flat side corresponding to the wafer flat. The trough 80' still provides a continuous vacuum around the periphery of the wafer. The wafer must be placed on the chuck in an orientation that aligns the fiducial with the flat of the trough 80'. By placing the concentric rings 76' and vacuum trough 80' within the exclusion zone, the area for building IC's is freed from print through and other artifacts from the mounting.

Figure 7:
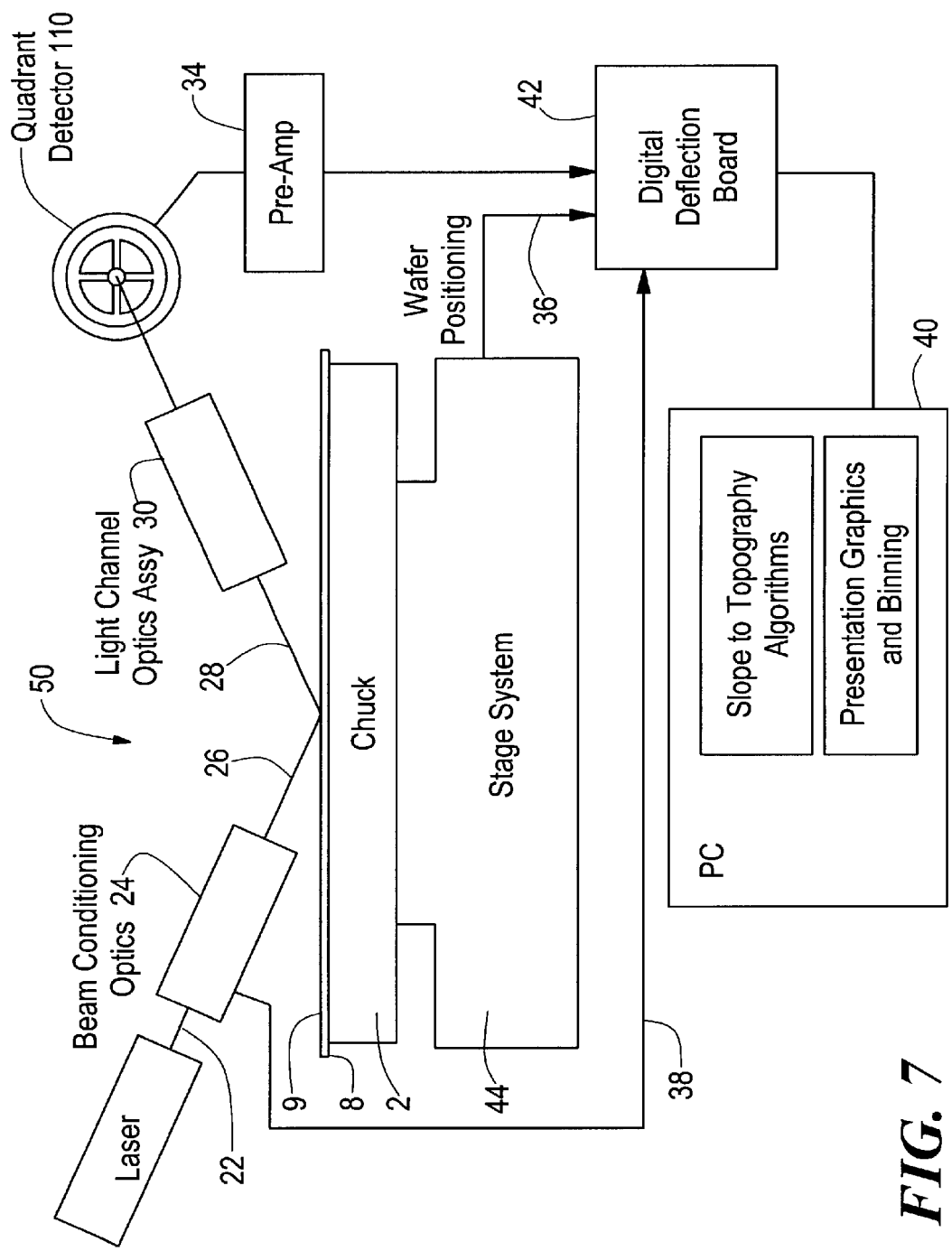
FIG. 7 is a block diagram of equipment utilizing the capabilities of the invention.

FIG. 7 illustrates an angle resolve scatter system 50 that is practical because of the increased stiffness of a wafer supported by the ring chuck of the invention. The accuracy of measuring the wafer's surface topography increases substantially using this design. This system can perform surface quality measurements (SQM) which measure the nano-typography of the wafer 8. Whereas the prior art had too much vibration to allow a reflected light beam received by a detector to be quantitatively measured, the stillness of the wafer 8 using the ring chuck allows use of a quadrant detector 110 as a light sensor. The collimated, typically low power laser beam 22 is directed into a beam conditioning optic assembly 24, which produces a telecentric, relatively short scan line 26, directed onto the wafer surface 9 at an angle. The specular reflection 28 of this beam is collected by a receiving optic assembly 30, which includes a lens and a quadrant detector 110. The optical system is such that the quadrant detector 110 is at the Fourier Transform Plane (FTP) of the optical system. This results in a focused spot on the center of the detector 110. By definition of the FTP, the spot will displace on the detector 110, only as a function of a change in the angular orientation of the wafer surface 9 at the incident point. By differentially comparing the signals from the 4 quadrants of the detector 110, the offset, and therefore the angular change is measured, corresponding to two orthogonal tilt axes of the wafer 8. The optical system is insensitive to wafer surface height variations, or lateral displacement of the scanning beam 26. A stage system 44, coordinated with the short laser scan, is used to scan the entire surface of the test wafer 8. The output of the quadrant detector 110 is used to generate a slope map of the surface 9 of the wafer. These slopes can be integrated to create a topographical map of the wafer, ranging from very fine surface characteristics to very gross surface characteristics.

The electrical output of the quadrant detector 110 is pre-amplified 34, then passed to a Digital Deflection Board 42, which also accepts position signals 36, 38 from the stage system 44 and the laser scanning system 24. The resulting information, which describes 2 axes of tilt for every position on the wafer 8, is supplied to the PC 40. Within the PC, algorithms are applied to convert slope data into topography data, and additional software modules provide the desired graphic and statistical presentation of the data.

Embodiments described have positioned the ring chuck concentric rings and vacuum troughs within the exclusion band. Even when the fiducial utilizes some part of the exclusion zone, the ring chuck can be placed just inside this feature and still within the band. In alternate implementations, where the ring chuck mechanism is positioned inside the exclusion band, the print through artifacts can be readily removed from the measured data because the rings and troughs are regular structures.

With contact rings having significantly less area in contact with the wafer than the vacuum area, the vacuum force that can be provided through the vacuum troughs can be increased from the industry typical force of 15 psi to higher levels. With these levels of force, the chuck and wafer may be spun up to vary high speeds, even beyond those sustainable by the wafer itself. Currently many measurements are taken at low rpm. More wafers can be tested with the greater testing capacity provided by using the higher rotational speeds.

Hoops on the ring chuck may be manufactured of non-conductive, non-contaminating materials as are known in the semiconductor industry. In particular, hoops made of Poly-ethyl-ethly-ketone (PEEK) are considered to exhibit less contamination than others do and are well accepted in the semiconductor industry.

In one implementation, the vacuum trough has been moved outboard such that the outer concentric ring is approximately 1.5 mm from the edge of the wafer. The vacuum trough area has been increased to increase the clamping force. Backside vacuum contact for this implementation applied to a 200 mm wafer is nearly 0.4%. This chuck can be used on scanning stations where the wafer is rotated at higher speed. The sag due to gravity is less compared to edge grip because of the contact throughout the edge of the wafer.

To further limit the sag and vibration of the central portion of the wafer 8, the volume between the top surface 75 of the base 74 and the wafer 8 is constructed so that the wafer/vacuum contact acts as a seal. The contained volume of air supports the interior of the wafer, dampening vibrations and limiting sag. In a further implementation, the volume between the base 74 and wafer 8 is pressurized after the vacuum seal has been established. By pressurizing slightly above atmospheric pressure, the weight of the wafer is supported by the volume of air. The pressurized air provides a predictable and uniform support to the wafer 8.

The uniform support and sealing capacity are enhanced when the annulus is manufactured of a slightly deformable material. When the vacuum is applied, the ring tips 96 deform against the backside of the wafer just enough to smooth out any small variations in the height of the tips 96. This smoothed surface provides a good seal that minimizes vacuum leakage and maximizes the clamping force. It is known in the industry to select materials that will maintain the essential shape of the rings 76 while deforming slightly to improve the contact.

Having described preferred embodiments of the invention it will now become apparent to those of ordinary skill in the art that other embodiments incorporating these concepts may be used. Accordingly, it is submitted that the invention should not be limited by the described embodiments but rather should only be limited by the spirit and scope of the appended claims.

What is claimed is:

1. A method to reduce the effects of artifacts while measuring a wafer comprising;

using a ring chuck with sub-millimeter wide concentric rings subtending a wider vacuum trough disposed about the outer circumference of said chuck to hold said wafer to a measurement instrument;

limiting defects caused by contamination from a chuck by minimizing the area of said chuck touching said wafer;

limiting the effect of print-through by gripping said wafer with said vacuum trough in the exclusion band; and modeling and verifying the print-through effect of said vacuum ring and subtracting said verified print-through effect from the measurement data.

2. The method of claim 1 further comprising:

modeling the vibration effect of spinning said wafer on said chuck;

refining the modeled vibration effect by measurement; and subtracting said refined vibration effect from measured data.

3. The method of claim 1 further comprising sealing the region contained within the innermost concentric ring wherein the stable volume of gas limits the vibration of the interior of said wafer.

4. The method of claim 3 further comprising pressurizing the region contained within the inner most concentric ring wherein said pressurized volume of gas supports the interior of said wafer.

5. A method to increase the stiffness of a wafer under test comprising holding said wafer utilizing a chuck with one approximately circular ring-shaped vacuum bounded by a pair of concentric walls at an edge of said chuck.

6. The method of claim 5 further comprising sealing a region bounded by the innermost concentric wall and a top surface of said chuck with said wafer wherein a stable volume of gas trapped therein limits the vibration of the interior of said wafer.

7. The method of claim 6 further comprising pressurizing said region contained within said ring-shaped vacuum wherein said pressurized volume of gas supports the interior of said wafer.

8. A method of providing a consistent and determinative contact between a wafer and a chuck comprising:

providing a ring chuck composed of one ring-shaped trough bounded by concentric rings disposed on a chuck base;

forming each said concentric ring from a non-contaminant material that is slightly compressible with a top having a width less than 0.4 mm; and supplying a vacuum pressure to said ring-shaped trough, said vacuum pressure sufficient to pull on said wafer, slightly deforming said concentric ring tops and yielding a contact that minimizes vacuum leakage.

9. The method of claim 8 wherein said ring-shaped trough is approximately twice as wide as said top of each said concentric ring.

10. A ring chuck adapted to hold a wafer with a vacuum comprising:

a pair of sub-millimeter-wide concentric rings subtending a wider vacuum trough disposed about an outer circumference of a chuck base;

wherein said concentric rings are formed of a non-contaminant material that is slightly compressible and a vacuum source for pulling on said wafer with sufficient force that said concentric rings are deformed by said force.

* * * * *